(12) United States Patent
Nayini et al.

(10) Patent No.: US 11,171,104 B2
(45) Date of Patent: Nov. 9, 2021

(54) IC CHIP PACKAGE WITH DUMMY SOLDER STRUCTURE UNDER CORNER, AND RELATED METHOD

(71) Applicant: MARVELL INTERNATIONAL LTD., Hamilton (BM)

(72) Inventors: Manish Nayini, Wappingers Falls, NY (US); Richard S. Graf, Gray, ME (US); Janak G. Patel, South Burlington, VT (US); Nazmul Habib, Colchester, VT (US)

(73) Assignee: MARVELL ASIA PTE, LTD., Singapore (SG)

( * ) Notice: Subject to any disclaimer, the term of this patent is extended or adjusted under 35 U.S.C. 154(b) by 11 days.

(21) Appl. No.: 16/662,293

(22) Filed: Oct. 24, 2019

(65) Prior Publication Data
US 2021/0125952 A1 Apr. 29, 2021

(51) Int. Cl.
*H01L 21/00* (2006.01)
*H01L 29/40* (2006.01)
(Continued)

(52) U.S. Cl.
CPC ............ *H01L 24/14* (2013.01); *B23K 1/0008* (2013.01); *H01L 21/4853* (2013.01); *H01L 21/563* (2013.01); *H01L 23/3157* (2013.01); *H01L 23/49805* (2013.01); *H01L 23/49816* (2013.01); *H01L 23/49838* (2013.01); *H01L 24/13* (2013.01); *H01L 24/16* (2013.01); *H01L 24/81* (2013.01); *B23K 2101/40* (2018.08); *H01L 2224/13211* (2013.01); *H01L 2224/13239* (2013.01); *H01L 2224/13247* (2013.01);
(Continued)

(58) Field of Classification Search
CPC .................. H01L 23/49805; H01L 23/49838
USPC ................ 257/735, 737, 780, 786; 438/611, 438/685–687, 461
See application file for complete search history.

(56) References Cited

U.S. PATENT DOCUMENTS

| 5,796,169 A | 8/1998 | Dockerty et al. |
| 6,858,941 B2 * | 2/2005 | Ference .................. H01L 24/11 |
| | | 257/781 |

(Continued)

FOREIGN PATENT DOCUMENTS

| EP | 2122674 | 7/2008 |
| KR | 100247716 B1 | 3/2000 |

(Continued)

*Primary Examiner* — Calvin Lee

(57) ABSTRACT

An IC chip package includes a substrate having a plurality of interconnect metal pads, and a chip having a plurality of interconnect metal pads arranged thereon. An interconnect solder structure electrically connects each of the plurality of interconnect metal pads. The chip is devoid of the interconnect solder structures and interconnect metal pads at one or more corners of the chip. Rather, a dummy solder structure connects the IC chip to the substrate at each of the one or more corners of the IC chip, and the dummy solder structure is directly under at least one side of the IC chip at the one or more corners of the IC chip. The dummy solder structure has a larger volume than a volume of each of the plurality of interconnect solder structures. The dummy solder structure eliminates a chip-underfill interface at corner(s) of the chip where delamination would occur.

18 Claims, 8 Drawing Sheets

(51) Int. Cl.
*H01L 23/00* (2006.01)
*H01L 23/498* (2006.01)
*H01L 21/48* (2006.01)
*H01L 21/56* (2006.01)
*B23K 1/00* (2006.01)
*H01L 23/31* (2006.01)
*B23K 101/40* (2006.01)

(52) U.S. Cl.
CPC ........... *H01L 2224/1403* (2013.01); *H01L 2224/14517* (2013.01); *H01L 2224/16227* (2013.01); *H01L 2224/81125* (2013.01); *H01L 2224/81815* (2013.01); *H01L 2924/014* (2013.01); *H01L 2924/0105* (2013.01); *H01L 2924/01029* (2013.01); *H01L 2924/01047* (2013.01); *H01L 2924/15321* (2013.01); *H01L 2924/18161* (2013.01); *H01L 2924/35121* (2013.01)

(56) References Cited

U.S. PATENT DOCUMENTS

| | | | |
|---|---|---|---|
| 7,176,555 B1 * | 2/2007 | Jao | H01L 24/13 257/620 |
| 7,215,026 B2 | 5/2007 | Park et al. | |
| 7,256,503 B2 | 8/2007 | Daubenspeck et al. | |
| 7,525,201 B2 | 4/2009 | Takashira | |
| 7,863,726 B2 * | 1/2011 | Chow | H01L 23/49816 257/692 |
| 8,362,609 B1 * | 1/2013 | Dosdos | H01L 23/315 257/730 |
| 8,686,560 B2 * | 4/2014 | Parvarandeh | H01L 24/17 257/737 |
| 9,128,148 B2 | 9/2015 | Lowney et al. | |
| 9,245,865 B1 | 1/2016 | Kwon et al. | |
| 9,721,906 B2 | 8/2017 | Dubey et al. | |
| 9,721,912 B2 * | 8/2017 | Khandekar | H01L 24/13 |
| 10,497,660 B2 * | 12/2019 | Chen | H01L 24/05 |
| 2008/0188038 A1 | 8/2008 | Khaw et al. | |
| 2009/0085227 A1 | 4/2009 | Shiraishi et al. | |

FOREIGN PATENT DOCUMENTS

| | | |
|---|---|---|
| TW | 200639986 A | 11/2006 |
| TW | I284969 B | 8/2007 |
| WO | 2008087530 A1 | 7/2008 |

* cited by examiner

IC CHIP PACKAGE WITH DUMMY SOLDER STRUCTURE UNDER CORNER, AND RELATED METHOD

BACKGROUND

The present disclosure relates to integrated circuit (IC) package fabrication, and more specifically, to a method to improve IC package reliability by providing dummy solder structures directly under a corner of the IC chip package instead of a chip corner to underfill (UF) interface.

Integrated circuit (IC) packages provide mechanisms for mounting an IC die or chip, and scaling wiring connections thereto. A flip chip ball grid array (FC-BGA) is one type of system used to electrically connect to an IC chip. FC-BGA packages include a plurality of controlled collapse chip connections (C4), i.e., small interconnect solder bump connections, in an array that connect to external circuitry of the IC chip. BGAs provide more interconnections than a flat package or a dual-line package because the entire surface of the IC chip is used rather than just an outer surface of the chip. Most BGAs are assembled on printed circuit boards, carriers or substrates that include a two-metal layer or multi-layered, high density ceramic substrate or organic laminate.

FC-BGA packages face the IC chip downwardly to provide a number of advantages such as a smaller footprint, easier assembly, reduced signal inductance, higher signal density, and reduced power/ground inductance. In this form, the IC chip has the C4s formed thereon and then is flipped and placed face down so the interconnect solder bumps connect directly to the substrate. The FC-BGA packages have an UF material, usually an epoxy, or acrylic and silicone material, inserted about the C4s to stabilize the interconnections, seal the interconnections from moisture and provide improved thermal cycling performance. One challenge with FC-BGA IC packages is that they can fail reliability tests due to delamination between the chip and the underfill at a corner of the IC chip. The delamination can lead to the interconnect solder bumps (C4) cracking and electrical failures. Delamination can be caused by cutting of the IC chips from a wafer. Delamination can also be caused by high stress at a lower temperature side of the IC chip from different coefficients of thermal expansion of materials. Delamination can also be caused by reduced adhesion between the underfill and IC chip at the higher temperature side of the IC chip, e.g., above a glass transition temperatures (Tg) of the underfill epoxy, it becomes softer and loses adhesion.

Approaches to address the problem include increasing the adhesion strength of the chip-underfill interface with grooves or protrusions or depositing more underfill at the corners of the IC chip. However, each of these approaches complicates the IC chip and/or package fabrication. Another approach adds dummy interconnect solder bumps near the corners of the IC chip that are identical to the active interconnect solder bumps. However, since interconnect solder bumps are placed on the IC chip before dicing of the chip from a wafer, such placement can violate dicing rules that prohibit dicing immediately adjacent to interconnect solder bumps. Notably, dicing in close proximity to interconnect solder bumps can lead to undesired removal of some of the interconnect solder bumps. Another approach increases the glass transition temperature (Tg) of the underfill, but this can lead to fillet cracking and may limit underfill material selection. Reduction in lid thickness and/or lid footprint to reduce stress has also been attempted, but these approaches can degrade package co-planarity and can impact yield.

SUMMARY

A first aspect of the disclosure is directed to an integrated circuit (IC) chip package, comprising: a substrate having a first plurality of interconnect metal pads thereon; an integrated circuit (IC) chip having a second plurality of interconnect metal pads arranged thereon; an interconnect solder structure electrically connecting each of the first and second plurality of interconnect metal pads, the IC chip being devoid of the interconnect solder structures at one or more corners of the IC chip; and a dummy solder structure connecting the IC chip to the substrate at each of the one or more corners of the IC chip, and wherein the dummy solder structure is directly under at least one side of the IC chip at the one or more corners of the IC chip, and wherein the dummy solder structure has a larger volume than a volume of each of the plurality of interconnect solder structures.

A second aspect of the disclosure includes a method, comprising: forming a first plurality of interconnect metal pads on an integrated circuit (IC) chip, except at one or more corners of the IC chip, and forming a first mounting metal pad in the one or more corners of the IC chip; forming a plurality of interconnect solder structure on the first plurality of interconnect metal pads on the IC chip; forming on a substrate: a second plurality of interconnect metal pads configured to couple with the first plurality of interconnect metal pads on the IC chip using the plurality of interconnect solder structures, and a second mounting metal pad at one or more locations of the substrate that are configured to align with a respective first mounting metal pad, each second mounting metal pad having a larger area than each of the first and second plurality of interconnect metal pads; forming a dummy solder structure on each second mounting metal pad on the substrate, each dummy solder structure being larger in area than each interconnect solder structure; and mounting the IC chip to the substrate, resulting in the plurality of interconnect solder structures interconnecting the first and second plurality of interconnect metal pads and the dummy solder structure interconnecting the one or more corners of the IC chip to the substrate.

A third aspect is directed to an integrated circuit chip, comprising: a body having circuitry therein; a plurality of interconnect metal pads on a surface of the body, the plurality of interconnect metal pads connected to the circuitry and each configured to receive an interconnect solder structure for electrically connecting the plurality of interconnect metal pads to a substrate; and a mounting metal pad in one or more corners of the body, the mounting metal pad having a larger area than the plurality of interconnect metal pads, the mounting metal pad configured to connect a dummy solder structure that is larger in volume than the interconnect solder structure to the body.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

Figure 1:
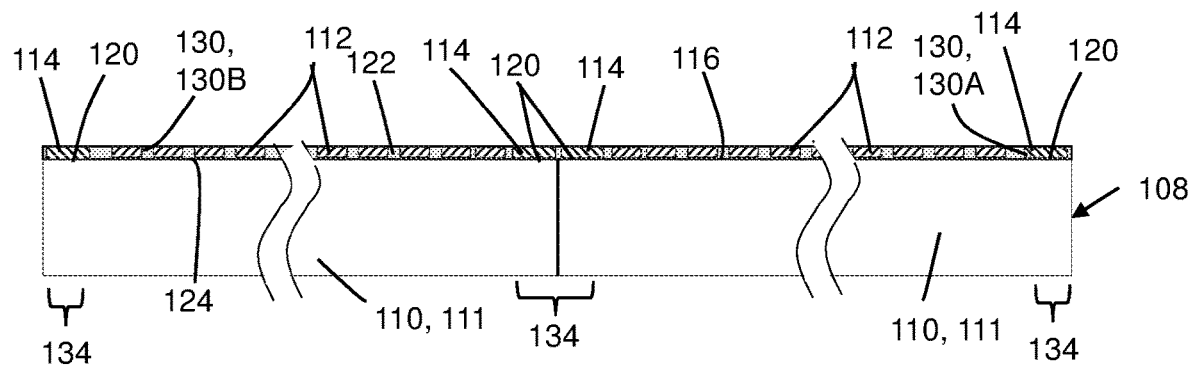
FIG. 1 shows a side view of an integrated circuit (IC) chip having interconnect and mounting metal pads formed thereon, according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

Embodiments of the disclosure provide an integrated circuit (IC) package and related method that use a dummy solder structure connecting the IC chip to the substrate at one or more corners of the IC chip. The dummy solder structure prevents underfill from forming under the corners of the IC chip where employed, and thus prevents chip-underfill delamination at the corners where delamination is usually initiated. Since the dummy solder structures are metal pads during dicing and receive solder from the laminate, their placement at the corner(s) of the IC chip does not violate dicing rules.

Referring to FIGS. 1-16, methods and IC packages according to various embodiments of the disclosure will be described.

FIGS. 1-11 show forming metal pads and interconnect solder structures on an integrated circuit (IC) chip or die 110 (hereinafter "IC chip 110"). IC chip 110 may include a body 111 having any now known or later developed IC chip circuitry therein, e.g., digital, analog, mixed, logic, comparator, switches, audio amplifiers, operational amplifiers, timers, etc. FIG. 1 shows a side view of a wafer 108 including a number of IC chips 110, e.g., two. While two IC chips 110 are shown, it is appreciated that a much larger number of IC chips 110 may be formed in each wafer; see e.g., FIGS. 8-10. Metal pads and interconnect solder structures may be formed on IC chip in a number of ways.

Figure 2:
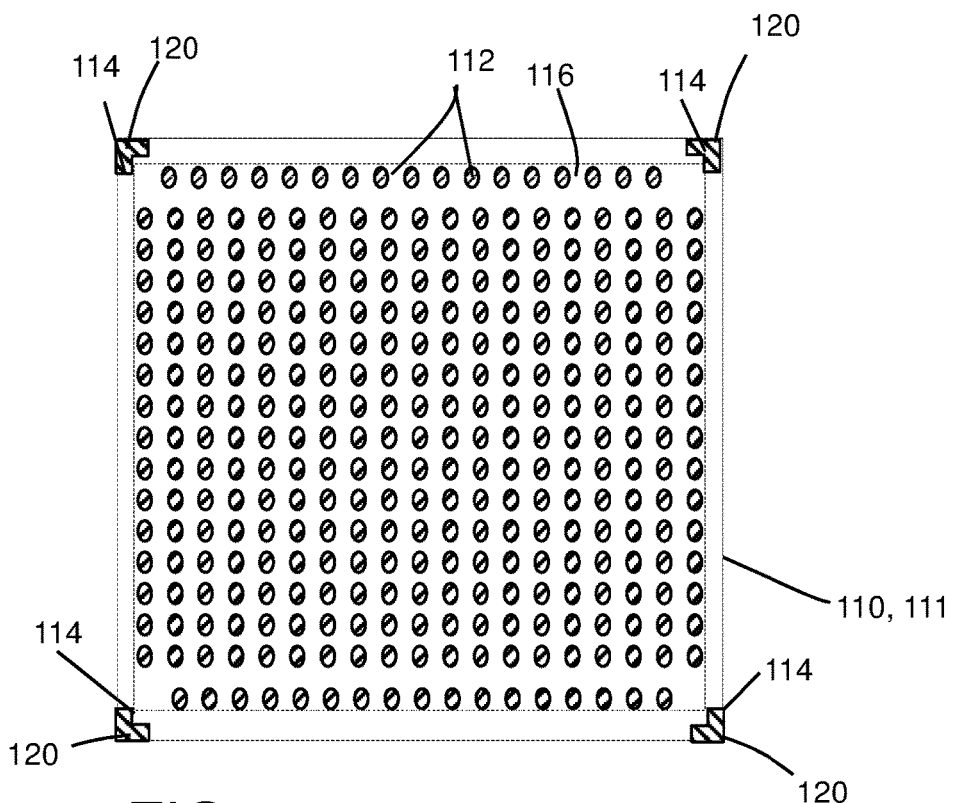
FIG. 2 shows a plan view of the IC chip having interconnect and mounting metal pads thereon, according to embodiments of the disclosure.

In one embodiment, shown in FIGS. 1-4, all of the metal pads may be formed using the same mask. FIG. 1 shows forming a first plurality of interconnect metal pads 112 and first mounting metal pad 114 on IC chip 110, i.e., on a surface 116 of IC chip 110. Interconnect metal pads 112 are formed except at one or more corners 120 of IC chip 110, where mounting metal pad(s) 114 are formed. FIG. 2 shows a plan view of a single IC chip 110 with first plurality of interconnect metal pads 112 and first mounting metal pad(s) 114 thereon. A dashed box in FIG. 2 (and FIGS. 4, 6 and 15) shows the outline of circuitry within IC chip 110. As used herein, "interconnect metal pads" are electrically connected to internal wiring within body 111 of IC chip 110 that extends to surface 116 of IC chip 110, and are used for active, electrical interconnection to wiring of a substrate, as described herein. In contrast, "mounting metal pad(s)" are not electrically connected to internal wiring of IC chip 110, are electrically inactive and act to physically connect IC chip 110 to a substrate, as described herein.

In FIG. 1 forming first plurality of interconnect metal pads 112 and first mounting metal pad(s) 114 includes forming a mask 122 over a seed layer 124 on IC chip 110, i.e., on surface 116. Seed layer 124 may include any appropriate material that allows formation of interconnect metal pads 112 on surface 116. "Mask" as used herein may refer to a layer of material which is applied over an underlying layer of material, and patterned to have openings, so that the underlying layer can be processed where there are openings. After processing the underlying layer, the mask may be removed. Common masking materials are photoresist (resist) and nitride. Nitride is usually considered to be a "hard mask." As illustrated, mask 122 includes a first set of openings 130B exposing areas for interconnect metal pads 112 and a second set of larger openings 130A exposing areas for mounting metal pads 114. As illustrated, openings 130A for mounting metal pads 114 are at least laterally larger than openings 130B for interconnect metal pads 112. Openings 130A may extend into a dicing channel 134 through which a dicing tool, e.g., a laser, will cut IC chip 110 from wafer 108. Openings 130A may extend slightly over circuitry within IC chip 110, but typically this would be to a minimal extent. Openings 130 are provided in one or more corners 120 of IC chip 110 at which chip-underfill delamination or other stress-related issues are to be addressed. As understood, dicing channels 134 are laterally outside of circuitry within IC chip 110; thus dicing through channels 134 does not damage circuitry within IC chip 110.

Interconnect metal pads 112 and mounting metal pads 114 may be formed in first set of openings 130B and second set of larger openings 130A in mask 122 by depositing material, e.g., a conductor, and planarizing to remove any excess material. "Depositing" may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation. In one non-limiting example, interconnect metal pads 112 and mounting metal pads 114 may include nickel-gold alloy formed by ALD. After metal pad formation, mask 122 may be removed using any now known or later developed ashing process.

Figure 3:
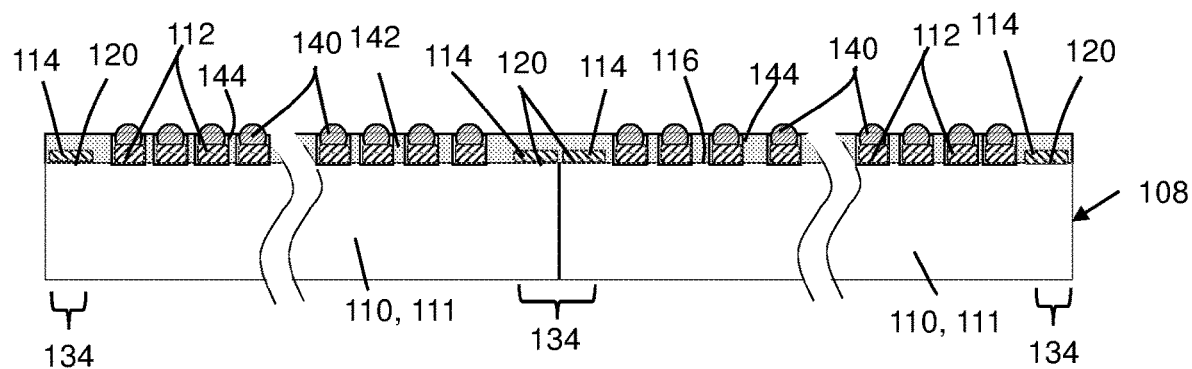
FIG. 3 shows a side view of the IC chip having interconnect solder structures formed thereon, according to embodiments of the disclosure.
Figure 4:
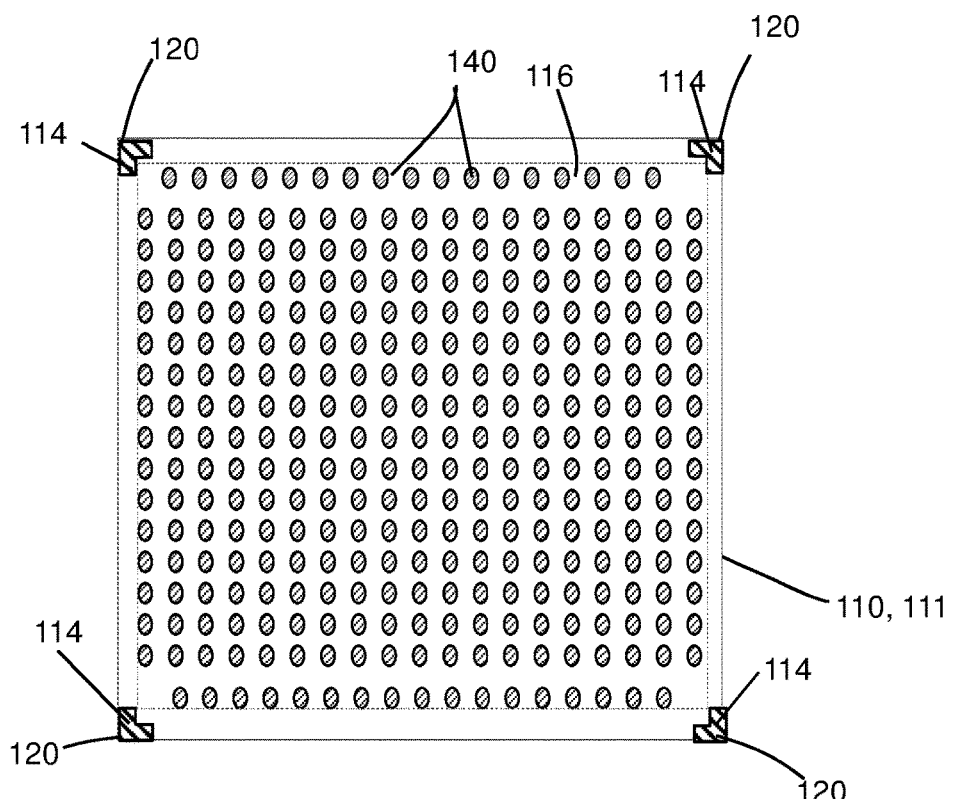
FIG. 4 shows a plan view of the IC chip having interconnect solder structures thereon, according to embodiments of the disclosure.

FIG. 3 shows a side view of forming a plurality of interconnect solder structures 140. FIG. 3 shows forming a mask 142 over surface 116 of IC chip 110. Mask 142 may include any of the materials of mask 122. Mask 142 covers mounting metal pad(s) 114, e.g., at corner(s) 120 of IC chip 110, and includes a third set of openings 144 exposing interconnect metal pads 112. Interconnect solder structures 140 are formed in third set of openings 144, e.g., by deposition of the desired material and planarization to remove excess material. In one non-limiting example, interconnect solder structures 140 may include tin-silver bumps or copper pillars. As used herein, "interconnect solder structures" are electrically connected to interconnect metal pads 112 on surface 116 of IC chip 110, and are used for active, electrical interconnection to wiring of a substrate, as described herein. Although shown as balls, interconnect solder structures 140 may include any now known or later developed ball grid array or C4 type conductive structure including but not limited to balls, bumps and/or pillars. As shown in the plan view of FIG. 4 of a single IC chip 110, mask 142 may be removed using any now known or later developed ashing process.

Figure 5:
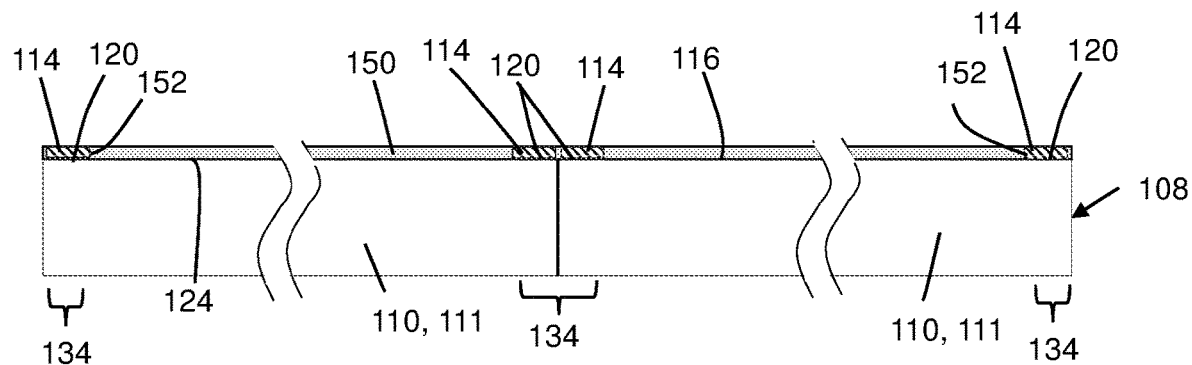
FIG. 5 shows a side view of an integrated circuit (IC) chip having mounting metal pads formed thereon, according to another embodiment of the disclosure.
Figure 6:
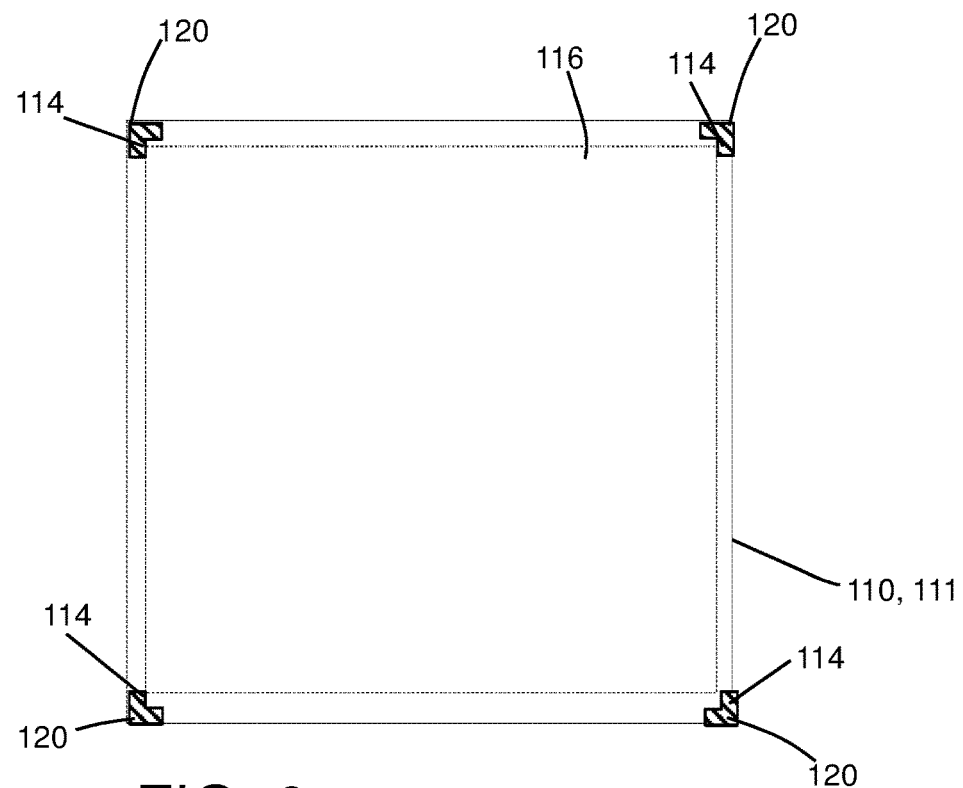
FIG. 6 shows a plan view of the IC chip having mounting metal pads thereon, according to another embodiment of the disclosure.

FIGS. 5-10 show another embodiment for forming interconnect metal pads 112 and mounting metal pad(s) 114 on IC chip 110, using more than one mask for the metal pads. FIG. 5 shows a side view and FIG. 6 shows a plan view of forming mounting metal pads 114, according to this embodiment. In this embodiment, as shown in FIG. 5, a mask 150 is formed over seed layer 124 on IC chip 110, i.e., surface 116 thereof. Mask 150 may be substantially similar to mask 122, described previously. Mask 150 may include a set of openings 152 exposing areas for mounting metal pads 114 only. Openings 152 may extend into dicing channel 134 between IC chips 110 on wafer 108—see center of FIG. 5. Openings 152 may extend slightly over circuitry within IC chip 110, but typically this would be to a minimal extent. FIG. 5 also shows forming mounting metal pads 114 in set of openings 152 using mask 150. In one non-limiting example, mounting metal pads 114 may include nickel-gold alloy formed by ALD. Any excess material may be removed by planarization. Mask 150 may be removed using any now known or later developed ashing process.

Figure 7:
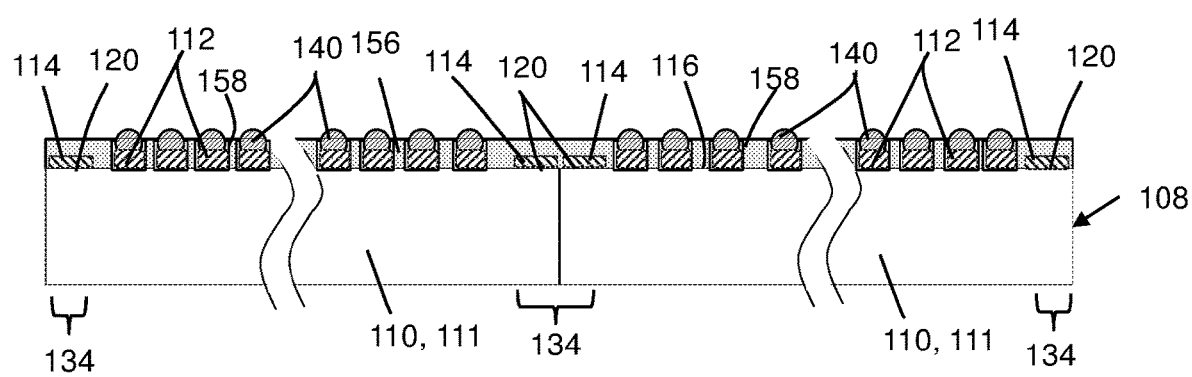
FIG. 7 shows a side view of the IC chip having interconnect metal pads and interconnect solder structures formed thereon, according to another embodiment of the disclosure.

FIG. 7 shows a side view of forming interconnect solder structures 140 and interconnect metal pads 112 with a single mask. In this embodiment, a mask 156 is formed on IC chip 110, i.e., on surface 116. Mask 156 covers mounting metal pads 114 and includes a set of openings 158 exposing areas for interconnect metal pads 112 and interconnect solder structures 140. Each of openings 158 is smaller than each of openings 152 (FIG. 5) in mask 150 (FIG. 5) used to form mounting metal pads 114. FIG. 5 also shows forming interconnect metal pads 112 and interconnect solder structures 140 in set of openings 158. Interconnect metal pads 112 and interconnect solder structures 140 may be formed in openings by sequentially depositing the desired material, e.g., conductors. In one non-limiting example, interconnect metal pads 112 may include nickel-gold alloy formed by ALD, and interconnect solder structures 140 may include tin-silver bumps or copper pillars formed by ALD. As noted, although shown as balls, interconnect solder structures 140 may include any now known or later developed ball grid array or C4 type conductive structure including but not limited to balls, bumps and/or pillars. Mask 156 may be removed using any now known or later developed ashing process. The finished structure is the same as shown in the plan view of FIG. 4.

While a number of processes have been described for forming interconnect metal pads 112, mounting metal pads 114 and interconnect solder structures 140, it is recognized that a large variety of other approaches are possible, and are considered within the skill in the art. In one other non-limiting example, a custom tool may be created that allows formation of all of the structures with a single mask.

Figure 8:
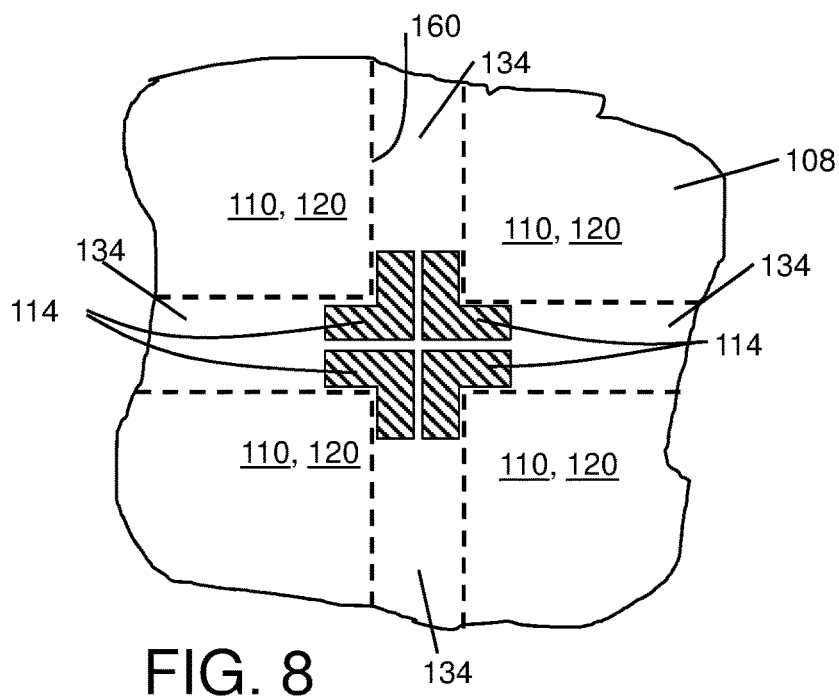
FIG. 8 shows a plan view of IC chips on a wafer having mounting metal pads thereon, according to yet another embodiment of the disclosure.
Figure 9:
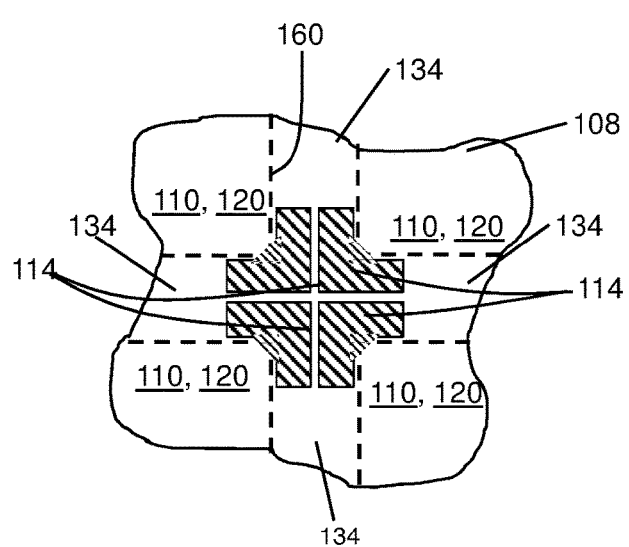
FIG. 9 shows a plan view of IC chips on a wafer having mounting metal pads thereon, according to other embodiments of the disclosure.
Figure 10:
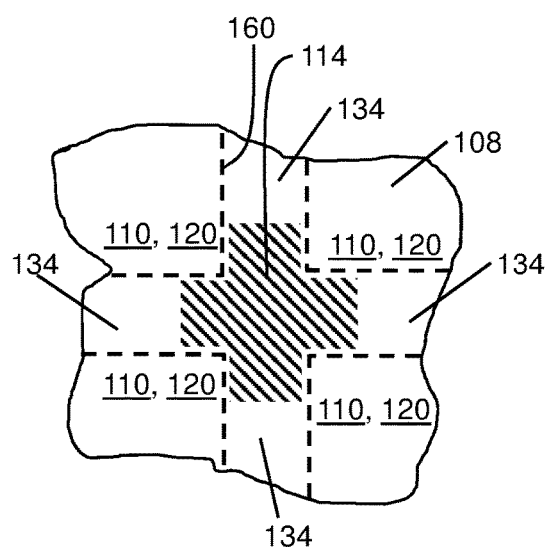
FIG. 10 shows a plan view of IC chips on a wafer having mounting metal pads thereon, according to additional embodiments of the disclosure.

FIGS. 8-10 show enlarged plan views of corners 120 of a number of IC chips 110 on wafer 108, and including mounting metal pads 114 extending into dicing channel 134. As illustrated, although shown as L-shaped in cross-sectional in FIGS. 2, 4 and 6, mounting metal pads 114 can take a variety of shapes, and can extend laterally outward of circuitry within IC chip 110 (shown by dashed lines adjacent dicing channels 134). Similarly, a shape of a dummy solder structure 182 (FIGS. 13-16), as will be described, formed on mounting metal pads 114 may have a variety of shapes. The shape of mounting metal pads 114 (and dummy solder structures 182) can be user defined, and can vary depending on many factors including but not limited to the shape and/or dimensions of circuitry within IC chip 110, the desired outside shape and/or dimensions of IC chip 110 (i.e., beyond the circuitry), and/or the shape and/or dimensions of substrate 166, the type of underfill 190 used, and/or the expected chip-underfill delamination or other stress-related issues. In any event, IC chip 110 does not include any interconnect solder structures 140 in corner(s) 120. Accordingly, when diced from wafer 108, IC chip 110 does not lose any interconnect solder structures 140.

Figure 11:
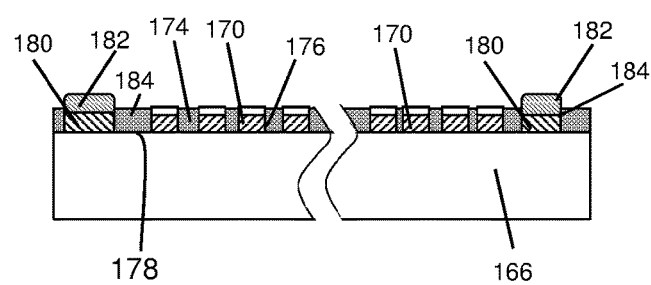
FIG. 11 shows a side view of a substrate having interconnect metal pads, mounting metal pads and dummy solder structures formed thereon, according to an embodiment of the disclosure.

FIG. 11 shows a side view of a substrate 166 according to embodiments of the disclosure. As used herein, "substrate" may include any structure upon which IC chip 110 may be mounted for electrical connection scaling and IC package formation. Substrate 166 may include, for example, a printed circuit board, carrier, or laminate, each of which includes a two-metal layer or multi-layered, high density ceramic or organic materials. Substrate 166 includes wiring therein to scale from interconnect metal pads 170 thereof.

FIG. 11 also shows interconnect metal pads 170 on substrate 166. Interconnect metal pads 170 on substrate 166 are configured to couple with interconnect solder structures 140 on IC chip 110. Interconnect metal pads 170 on substrate 166 may be provided as part of substrate 166, or may be formed thereon using any now known or later developed masked solder paste or place-solder structure process. In the non-limiting example shown, interconnect metal pads 170 on substrate 166 may be formed using a mask 174 having a set of openings 176 therein. Openings 176 expose a seed layer 178 on substrate 166, i.e., on surface thereof. Seed layer 178 may include any appropriate material that allows formation of interconnect metal pads 170. Interconnect metal pads 170 may be formed in openings 176 by depositing, for example, copper by, e.g., by ALD. Interconnect metal pads 170 may be solderless (as shown), or they may include solder thereon, e.g., tin (Sn), nickel-gold alloy (Ni/Au), nickel-palladium-gold alloy (Ni/Pd/Au) or other solders. FIG. 11 also shows mounting metal pad(s) 180 at one or more locations of substrate 166. Mounting metal pad(s) 180 may be provided on substrate 166, or formed thereon with interconnect metal pads 170 or in a separate masking process. Mounting metal pad(s) 180 are configured to align with a respective mounting metal pad 114 (FIG. 7) on IC chip 110. To match mounting metal pad 114 on IC chip 110, each mounting metal pad 180 on substrate 166 has a larger area than each of first and second plurality of interconnect metal pads 112 (FIG. 7) and 170, and is typically commensurate in area (and perhaps shape) with mounting metal pad(s) 114 on IC chip 110. Thus, forming mounting metal pads 114, 180 includes forming them both with larger area than each of interconnect metal pads 112, 170. Mounting metal pad(s) 180 does not have to be the same size or shape as mounting metal pad(s) 114 on IC chip 110, but it can be the same size and/or shape. In certain embodiments, metal mounting pad(s) 180 may be formed on substrate 166 such that they extend laterally beyond at least one side 188 of IC chip 110 after mounting the IC chip to the substrate (see e.g., FIG. 16).

FIG. 11 also shows forming a dummy solder structure 182 on each mounting metal pad 180 on substrate 166. Dummy solder structure 182 may be formed in a set of openings 184 in mask 174, e.g., by deposition of the desired material as part of second masked solder paste or place-solder structure process. Alternatively, as with interconnect solder structures 140 on IC chip 110, one mask may be used to form interconnect metal pads 170, and another mask used to form mounting metal pads 180 and dummy solder structures 182. As used herein, "dummy solder structures," as will be described, physically connect mounting metal pads 114 on surface 116 of IC chip 110 and mounting metal pads 180 on substrate 166, but are electrically inactive. Although shown as blocks, interconnect metal pads 170 may include any now known or later developed metal pads. In one non-limiting example, dummy solder structures 182 may include tin-silver bumps or copper pillars. As illustrated, in certain embodiments, dummy solder structures 182 have a larger volume than a volume of each of the plurality of interconnect solder structures 140, i.e., individually. The larger volume allows for wider distribution of dummy solder structures 182 within corner(s) 120, which as will be described, allows for greater separation of underfill 190 (FIG. 14-16) from corner(s) 120 and thus a larger reduction in stress. In certain embodiments, dummy solder structure 182 may also include a solder material that is softer than the solder material of each of interconnect solder structures 140. The softer solder material may allow for more stress reduction at the chip-underfill interface. The softer solder material may also allow more coining (compaction and/or distribution) of dummy solder structure 182 compared to interconnect solder structures 140 to allow for desired spacing of IC chip 110 and substrate 166 despite dummy solder structures 182 being of larger volume. Each dummy solder structure 182 may be larger in area than each interconnect solder structure 140.

Figure 12:
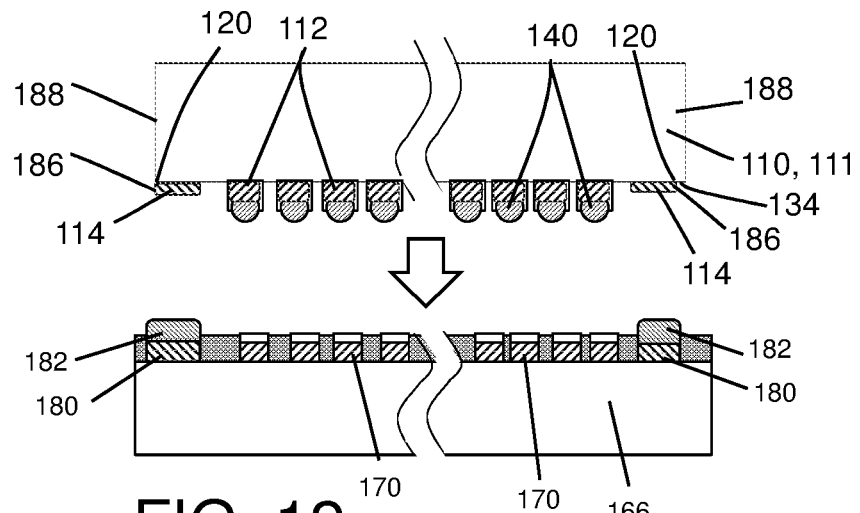
FIG. 12 shows a side view of mounting an IC chip to a substrate, according to embodiments of the disclosure.
Figure 13:
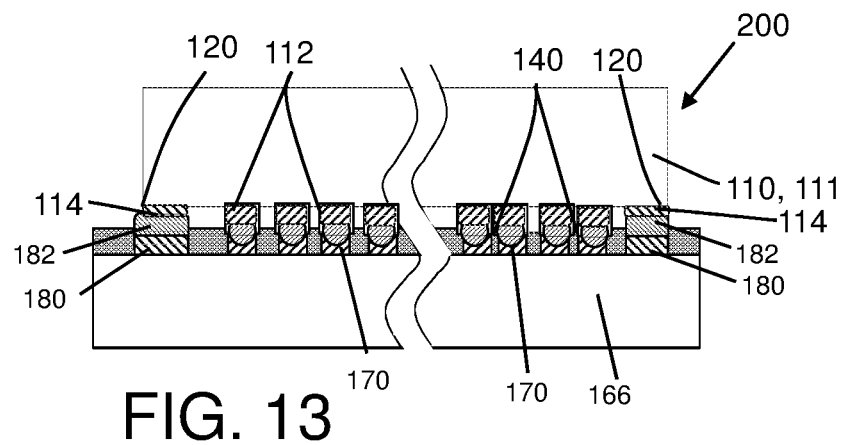
FIG. 13 shows a side view of the IC chip mounted to the substrate, according to embodiments of the disclosure.

FIG. 12 shows a side view of mounting IC chip 110 to substrate 166, and FIG. 13 shows a side view of one embodiment of an IC package 200 so formed. At this stage, as shown in FIG. 12, IC chip 110 has been diced from wafer 108. In contrast to conventional IC chips, IC chip 110 includes mounting metal pad(s) 114 in corner(s) 120 thereof. Since no interconnect solder structures 140 were formed in corner(s) 120, IC chip 110 does not include any interconnect solder structures in corner(s) 120, and it is incapable of losing any during dicing. In certain embodiments, as shown in the left side of FIG. 12, since mounting metal pads 114 are formed in each of corner(s) 120 of IC chip 110 prior to dicing the IC chip from wafer 108, and they may be formed in dicing channels 134 (FIGS. 1, 3, 5, 7-10), when IC chips 110 are diced, an outer side 186 of mounting metal pads 180 may be coplanar with side 188 of IC chip 110. That is, mounting metal pad 114 extends through side 188 of IC chip 110 after dicing the IC chip from wafer 108. That is, the dicing tool will pass through a center portion of dicing channel 134, which leaves a portion of mounting metal pad 114 on corner(s) 120 of the diced IC chip beyond the circuitry therein. In this case, the dicing tool cuts mounting metal pads 114 and IC chip 110 to have coplanar sides 186, 188. A portion of mounting metal pads 114 may extend slightly over circuitry within IC chip 110 (see, e.g., FIGS. 9 and 15), but typically this would be to a minimal extent. In other embodiments, depending on the spacing between adjacent IC chips' 110 mounting metal pads 114, as shown in right side of FIG. 12, some extent of dicing channel 134 may remain to separate outer side 186 of mounting metal pads 114 from side 188 of IC chip 110.

IC chip 110 may be mounted to substrate 166 using any now known or later developed process, e.g., aligning, positioning together and thermal reflow. The mounting results in interconnect solder structures 140 (from IC chip 110) connecting interconnect metal pads 112 and 170, and dummy solder structure 182 connecting one or more corners 120 of IC chip 110 to substrate 166, e.g., using mounting metal pads 114, 180.

Figure 14:
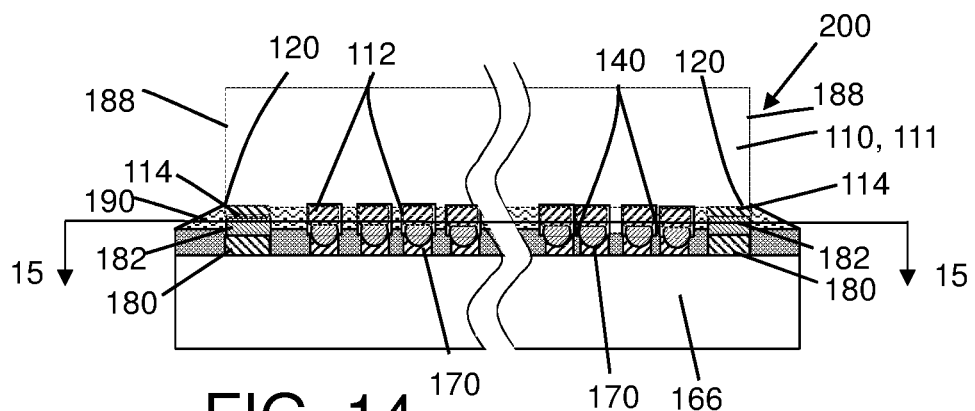
FIG. 14 shows a side view of injecting underfill between the IC chip and the substrate, and an IC package, according to embodiments of the disclosure.
Figure 15:
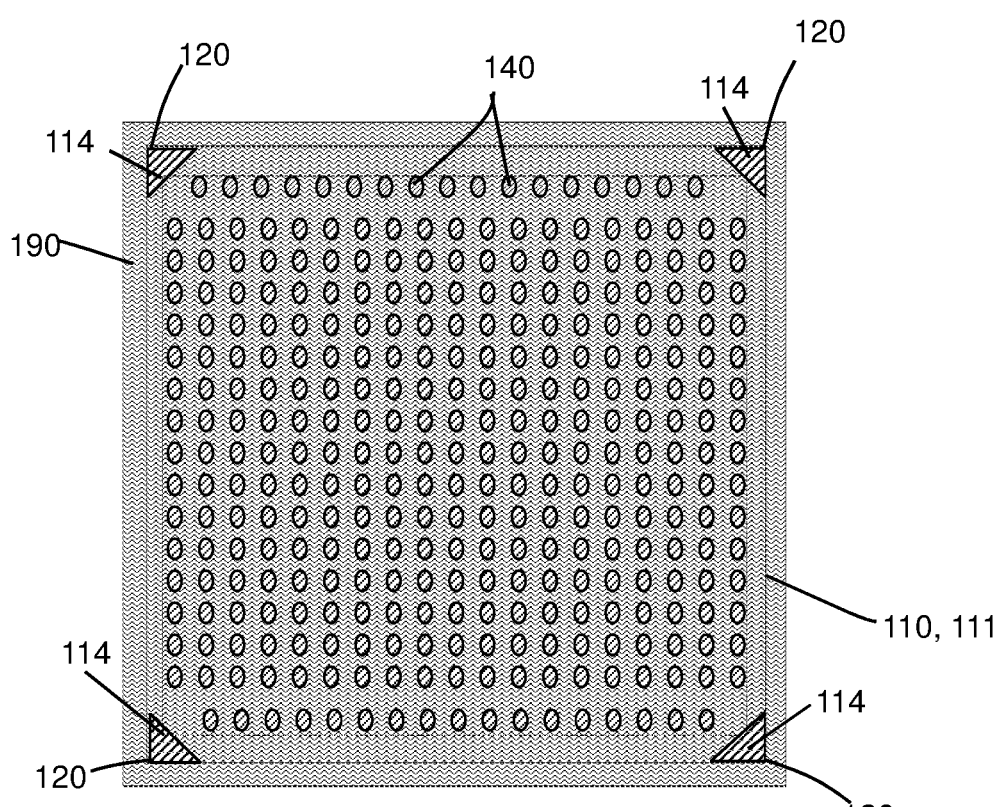
FIG. 15 shows a plan view of the IC package through view line 15-15 of FIG. 14.

FIG. 14 shows forming an underfill 190 extending between IC chip 110 and substrate 166 and into an area about interconnect solder structures 140 and dummy solder structure 182. As illustrated, however, dummy solder structure 180 prevents the underfill 190 from being under one or more corners 120 of IC chip 110. FIG. 15 shows a plan view along view line 15-15 in FIG. 14 illustrating how dummy solder structure 180 prevents underfill 190 from being present in corner(s) 120 of IC chip 110. In certain embodiments, as shown in FIG. 16, dummy solder structure 182 at corner(s) 120 of IC chip 110 may extend laterally outward beyond at least one side 188 of IC chip 110.

Figure 16:
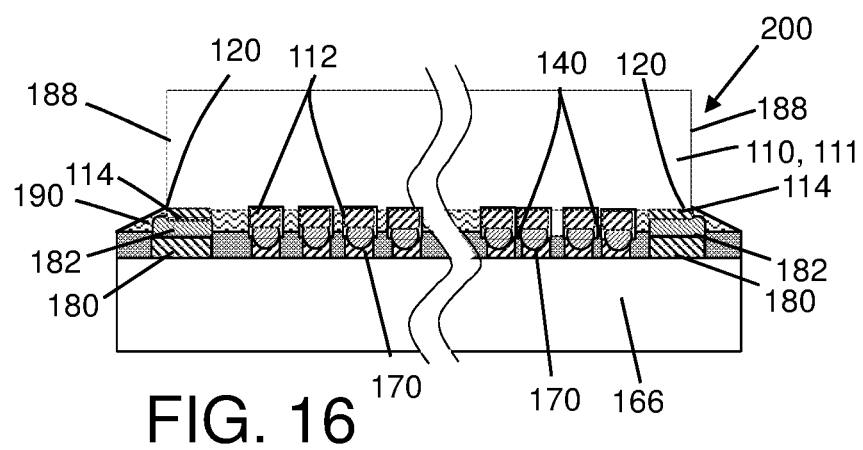
FIG. 16 shows a side view of an IC package, according to other embodiments of the disclosure.

FIGS. 13, 14 and 16 show side views of an IC package 200 according to various embodiments of the disclosure. IC package 200 includes substrate 166 having a first plurality of interconnect metal pads 170 thereon. IC chip package 200 also includes IC chip 110 having a second plurality of interconnect metal pads 112 arranged thereon, and an interconnect solder structure 140 electrically connecting each of first and second plurality of interconnect metal pads 112, 170. IC chip 110 is devoid of interconnect solder structures 140 at one or more corners 130 of the IC chip. Rather, IC chip package 120 includes dummy solder structure 182 connecting IC chip 110 to substrate 166 at each of the one or more corners 120 of the IC chip. IC chip package 200 may include mounting metal pad(s) 114 in corner(s) 120 of IC chip 110 that are configured to couple to dummy solder structure 182, and mounting metal pad(s) 180 on substrate 166 that are configured to couple to dummy solder structure 182. Metal pads 112, 114, 170, 180 may be made of, for example, a nickel-gold alloy.

Dummy solder structure 182 thus mechanically couples respective mounting metal pads 114, 180 together. Hence, dummy solder structure 182 and respective mounting metal pads 114, 180 are electrically inactive, in contrast to interconnect solder structures 140 and respective interconnect metal pads 112, 170 that are electrically active, i.e., they carry electrical current. In contrast to conventional interconnect solder structures, dummy solder structure 182 is directly under side(s) 188 of each of corner(s) 120 of IC chip 110, where employed. That is, at least part of dummy solder structure 182 is aligned vertically under side(s) 188 of IC chip 110. An underfill 190 may extend between IC chip 110 and substrate 166 and into an area about the interconnect solder structures 140 and dummy solder structure 182. However, in contrast to conventional IC packages, dummy solder structure 182 prevents underfill 190 from being under a respective corner(s) 120 of the IC chip, which eliminates the chip-underfill interface at the corner(s) and the related delamination and stress-related issues.

Dummy solder structure 182 may also have a larger volume than a volume of each of interconnect solder structures 140. Mounting metal pads 114, 180 may also be larger in area than each of interconnect metal pads 112, 170 to accommodate the larger volume of dummy solder structure 182. The larger solder volume and metal pad size can be customized to create any desired sized dummy solder structure 182. For example, in certain embodiments, dummy solder structure 182 is directly under side(s) 188 of each of corner(s) 120 of IC chip 110, but does not extend laterally beyond side(s) 188. In this case, mounting metal pad 180 on substrate 166 may be aligned with or nearly aligned with side 188 of IC chip 110. In other examples, shown in the left side of FIG. 13 and FIG. 16, dummy solder structure 182 may extend laterally outward beyond side(s) 188 of IC chip 110. That is, dummy solder structure 182 extends under and beyond side(s) 188 of IC chip 110, outside the boundary of the chip. In this latter case, as shown in FIG. 16, mounting metal pad 180 on substrate 166 may also extend laterally beyond side 188 of IC chip 110.

As noted, each dummy solder structure 182 and each interconnect solder structure 140 may include, for example, one of a tin-silver alloy and copper. In certain embodiments, however, dummy solder structure 182 may include a solder material that is softer than a different (in at least hardness), second solder material of interconnect solder structures 140 to reduce the stress at the chip-underfill interface. Because mounting metal pad 180 in corner(s) 120 of IC chip 120 is/are in a dicing channel 134 of the IC chip, in contrast to conventional IC chips, mounting metal pad 180 may extend through a side 188 of IC chip 110 after the chip is diced from wafer 108.

While example materials have been listed herein for metal pads and solder structures, it is recognized that any now known or later developed materials used for such structures that otherwise meet the limitations described herein may be employed.

While dummy solder structures 182 and mounting metal pads 114, 180 have been illustrated in each corner 120 of IC chip package 200, they may be selectively used in only corners 120 where chip-underfill delamination or other stress-related issues are a concern.

Embodiments of the disclosure provide embodiments of IC package 200, IC chip 100 and related methods that use dummy solder structure 182 connecting IC chip 110 to substrate 166 at one or more corners 120 of the IC chip. Dummy solder structure 182 prevents underfill 190 from forming under the corner(s) 120 of IC chip 110, and thus prevents chip-underfill delamination at the corners where delamination is normally prevalent. Since dummy solder structures 182 are inactive, their placement at corner(s) 120 of the IC chip does not violate dicing rules. Dummy solder structures 182 may also be larger than the active interconnect solder structures, i.e., controlled collapse chip connections (C4), and thus are more immune to damage caused by dicing. While embodiments of the disclosure have been described relative to FC-BGA applications, it is emphasized that the teachings are equally applicable to land grid arrays (LGA) or other package-to-card interconnect options.

The method as described above is used in the fabrication of integrated circuit chips and chip packages. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A method, comprising:
   forming a first plurality of interconnect metal pads on an integrated circuit (IC) chip, except at one or more corners of the IC chip, and forming a first mounting metal pad in the one or more corners of the IC chip;
   forming a plurality of interconnect solder structures on the first plurality of interconnect metal pads on the IC chip, wherein the IC chip is devoid of the interconnect solder structures at the one or more corners of the IC chip;
   forming on a substrate:
   a second plurality of interconnect metal pads configured to couple with the first plurality of interconnect metal pads on the IC chip using the plurality of interconnect solder structures, and
   a second mounting metal pad at one or more locations of the substrate that are configured to align with a respective one of the first mounting metal pads, each of the second mounting metal pads having a larger area than each of the first and second plurality of interconnect metal pads;
   forming a dummy solder structure on each of the second mounting metal pads on the substrate, each of the dummy solder structures being larger in area than each of the interconnect solder structures;
   mounting the IC chip to the substrate, resulting in the plurality of interconnect solder structures interconnecting the first and second plurality of interconnect metal pads and the dummy solder structure interconnecting the one or more corners of the IC chip to the substrate; and
   forming an underfill extending between the IC chip and the substrate and into an area surrounding the interconnect solder structures and the dummy solder structure, wherein the dummy solder structure prevents the underfill from being disposed under a respective one of the corners of the IC chip.

2. The method of claim 1, wherein forming the first plurality of interconnect metal pads and the first mounting metal pad on the IC chip includes:
   forming a first mask over a seed layer on the IC chip, the first mask including a first set of openings exposing areas for the first plurality of interconnect metal pads and a second set of larger openings exposing areas for the first mounting metal pads,
   forming the first plurality of interconnect metal pads and the first mounting metal pads in the first set of openings and the second set of larger openings, and
   removing the first mask; and
   wherein forming the plurality of interconnect solder structures includes:
   forming a second mask over a surface of the IC chip, the second mask covering the first mounting metal pads and including a third set of openings exposing the first plurality of interconnect metal pads,
   forming the plurality of interconnect solder structures in the third set of openings, and removing the second mask.

3. The method of claim 1, wherein forming the first plurality of interconnect metal pads and the first mounting metal pad on the IC chip includes:
   forming a first mask over a seed layer on the IC chip, the first mask including a first set of openings exposing areas for the first mounting metal pads,
   forming the first mounting metal pads in the first set of openings using the first mask, and
   removing the first mask; and
   wherein forming the plurality of interconnect solder structures includes:
   forming a second mask on the IC chip, the second mask covering the first mounting metal pads and including a second set of openings exposing areas for the first plurality of interconnect metal pads and the plurality of interconnect solder structures, wherein each of the second set of openings is smaller than each of the first set of openings in the first mask,
   forming the first plurality of interconnect metal pads and the plurality of interconnect solder structures in the second set of openings, and
   removing the second mask.

4. The method of claim 1, wherein forming the first mounting metal pad in each of the one or more corners of the IC chip occurs prior to dicing the IC chip from a wafer, and also includes forming the first mounting metal pad in a dicing channel on the wafer, and
   wherein the first mounting metal pad extends through a side of the IC chip after dicing the IC chip from the wafer.

5. The method of claim 1, wherein forming the first and second mounting metal pads includes forming the first and second mounting metal pads with larger area than each of the first and second plurality of interconnect metal pads.

6. The method of claim 1, wherein the dummy solder structure includes a first solder material that is softer than a different, second solder material of each of the plurality of interconnect solder structures.

7. The method of claim 1, wherein the dummy solder structure at the one or more corners of the IC chip extends laterally outward beyond at least one side of the IC chip.

8. The method of claim 1, wherein the dummy solder structure has a larger volume than a volume of each of the plurality of interconnect solder structures.

9. An integrated circuit (IC) chip package, comprising:
   a substrate having a first plurality of interconnect metal pads and a first plurality of mounting metal pads arranged thereon, the first plurality of interconnect metal pads electrically connected to internal wiring of the substrate, and the first plurality of mounting metal pads not electrically connected to the internal wiring of the substrate;
   an integrated circuit (IC) chip having a second plurality of interconnect metal pads and a second plurality of mounting metal pads arranged thereon, the second plurality of interconnect metal pads electrically connected to internal wiring of the IC chip, and the second plurality of mounting metal pads not electrically connected to the internal wiring of the IC chip;
   an interconnect solder structure connecting each of the first and second plurality of interconnect metal pads, the IC chip being devoid of the interconnect solder structures at one or more corners of the IC chip;
   a dummy solder structure connecting the first and second plurality of mounting metal pads;

and an underfill extending between the IC chip and the substrate and into an area surrounding the interconnect solder structures and the dummy solder structure, wherein the dummy solder structure prevents the underfill from being disposed under a respective one of the corners of the IC chip.

10. The IC chip package of claim 9, wherein the dummy solder structure is directly under at least one side of the IC chip at the one or more corners of the IC chip, and wherein at least one dummy solder structure extends laterally outward beyond the at least one side of the IC chip.

11. The IC chip package of claim 9, wherein the dummy solder structure includes a first solder material that is softer than a different, second solder material of the interconnect solder structures.

12. The IC chip package of claim 9, wherein each dummy solder structure and each interconnect solder structure includes one of a tin-silver alloy and copper.

13. The IC chip package of claim 9, wherein the dummy solder structure has a larger volume than a volume of each of the interconnect solder structures.

14. The IC chip package of claim 9, further comprising:
a first mounting metal pad in the one or more corners of the IC chip, the first mounting metal pad configured to couple to the dummy solder structure; and
a second mounting metal pad on the substrate, the second mounting metal pad configured to couple to the dummy solder structure,
wherein the dummy solder structure mechanically couples respective first and second mounting metal pads together, and
wherein each of the first and second mounting metal pads are larger in area than each of the first and second plurality of interconnect metal pads.

15. The IC chip package of claim 14, wherein the dummy solder structure is directly under at least one side of the IC chip at the one or more corners of the IC chip, and wherein the second mounting metal pad on the substrate extends laterally beyond the at least one side of the IC chip.

16. The IC chip package of claim 14, wherein the dummy solder structure and respective first and second mounting metal pads are electrically inactive, and each interconnect solder structure and respective interconnect metal pad are electrically active.

17. The IC chip package of claim 14, wherein the first mounting metal pad in the one or more corners of the IC chip is in an area adjacent a dicing channel of the IC chip.

18. The IC chip package of claim 14, wherein the first mounting metal pad extends through a side of the IC chip.

* * * * *